United States Patent
Conq et al.

(10) Patent No.: US 11,003,526 B2
(45) Date of Patent: May 11, 2021

(54) METHOD FOR PROCESSING A SIGNAL COMPRISING DETECTION OF INTERFERENCE CAUSED BY A LIGHTNING STRIKE

(71) Applicant: SAFRAN ELECTRONICS & DEFENSE, Boulogne-Billancourt (FR)

(72) Inventors: Mathieu Conq, Boulogne-Billancourt (FR); Nicolas Geneste, Boulogne-Billancourt (FR); Manuel Fernandes Gomes, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 16/772,291

(22) PCT Filed: Dec. 13, 2018

(86) PCT No.: PCT/FR2018/053262
§ 371 (c)(1),
(2) Date: Jun. 12, 2020

(87) PCT Pub. No.: WO2019/115953
PCT Pub. Date: Jun. 20, 2019

(65) Prior Publication Data
US 2021/0089386 A1 Mar. 25, 2021

(30) Foreign Application Priority Data
Dec. 14, 2017 (FR) ...................................... 1762138

(51) Int. Cl.
G06F 11/10 (2006.01)
G01R 31/00 (2006.01)
G01R 29/08 (2006.01)

(52) U.S. Cl.
CPC .......... *G06F 11/10* (2013.01); *G01R 29/0842* (2013.01); *G01R 31/008* (2013.01)

(58) Field of Classification Search
CPC .... G06F 11/10; G01R 29/0842; G01R 31/008
(Continued)

(56) References Cited

U.S. PATENT DOCUMENTS

| 5,525,906 A | 6/1996 | Crawford et al. |
| 2012/0240667 A1* | 9/2012 | Geneste ................ G01P 21/02 |
| | | 73/112.01 |

(Continued)

FOREIGN PATENT DOCUMENTS

| EP | 2955488 A1 | 12/2015 |
| WO | 2007000882 A1 | 1/2007 |

OTHER PUBLICATIONS

International Search Report (PCT/ISA/210) and Written Opinion (PCT/ISA/237) dated Mar. 22, 2019 issued by the International Searching Authority in International Application No. PCT/FR2018/053262.

(Continued)

*Primary Examiner* — Giovanni Astacio-Oquendo
(74) *Attorney, Agent, or Firm* — Sughrue Mion, PLLC

(57) ABSTRACT

A method for processing a signal on board an aircraft. An electronic control unit receives an input signal including useful data in a first passband, implements a first operation of bandpass filtering the input signal with a first passband to obtain a useful signal containing the useful data, with detection of interference caused by a lightning strike. The electronic control unit implements a second operation of bandpass filtering the input signal to obtain a detection signal, the bandpass filter having a second passband that is distinct from the first passband, comparing a detection value derived from the detection signal with a detection threshold, (Continued)

and correcting the exploitation of the useful data if exceeded.

12 Claims, 3 Drawing Sheets

(58) Field of Classification Search
USPC ...... 324/76.29, 76.45, 76.68, 604, 605, 606; 714/776
See application file for complete search history.

(56) References Cited

U.S. PATENT DOCUMENTS

| 2012/0256636 A1* | 10/2012 | Truong | H02M 1/32 |
| | | | 324/415 |
| 2016/0077132 A1* | 3/2016 | Geneste | G01R 15/14 |
| | | | 324/123 R |

OTHER PUBLICATIONS

Communication dated Aug. 2, 2018, issued by the French Patent Office in counterpart French Application No. 1762138.
Anonymous, "EUROCAE ED 14: Environmental Conditions and Test Procedures for Airborne Equipment", Jan. 1, 2015, Retrieved from: URL:https://global.ihs.com/doc_detail.cfm?document_name=EUROCAE%20ED2014&item_s_key=00156824.

* cited by examiner

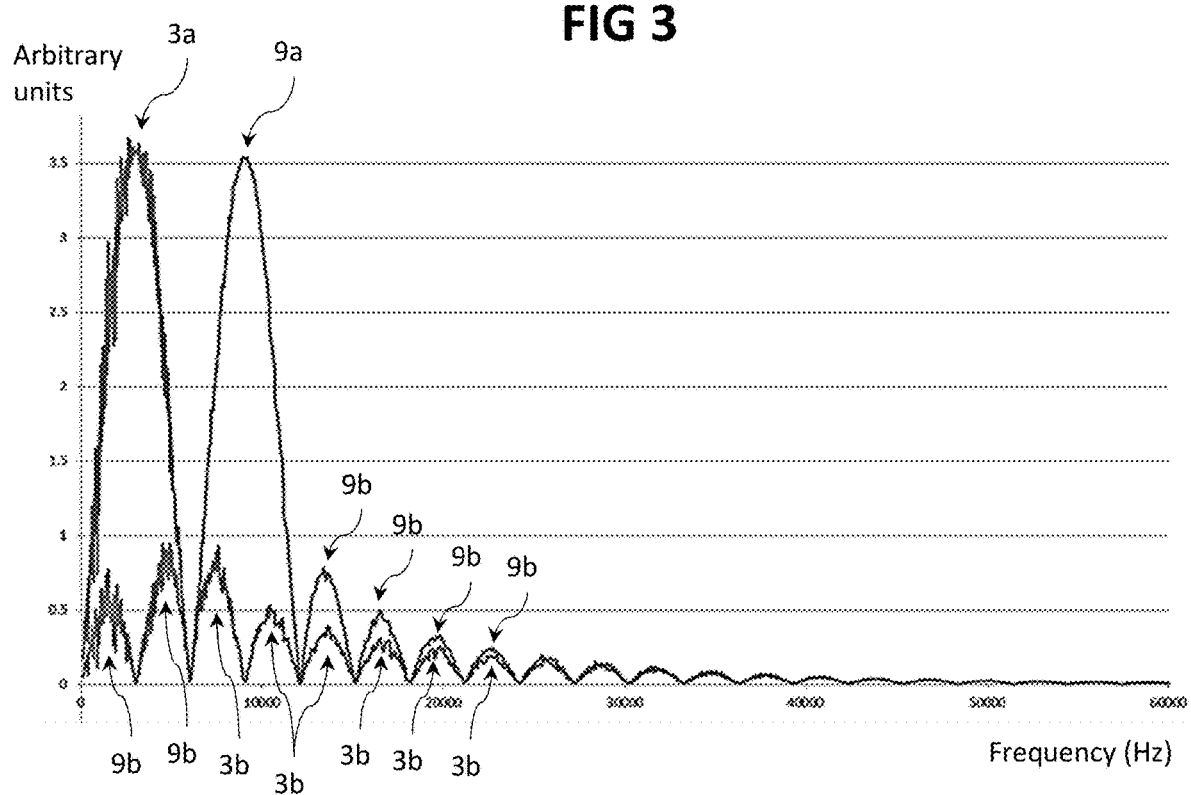
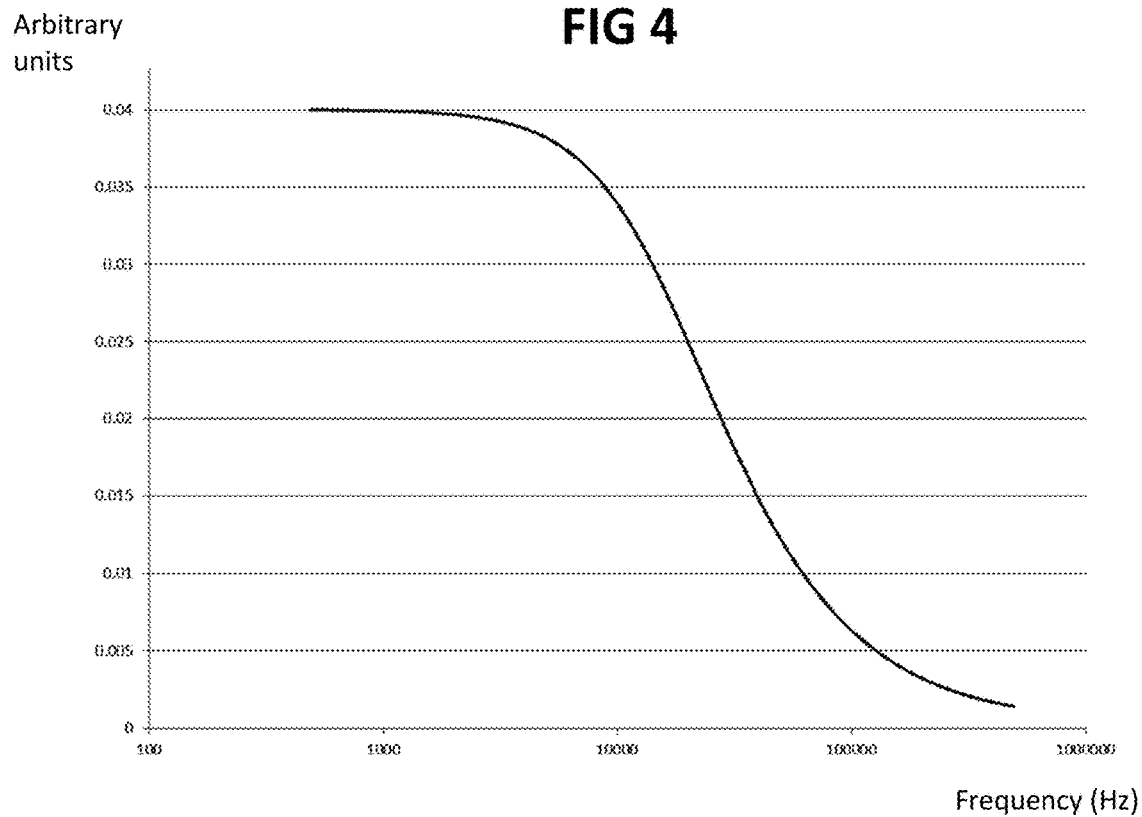

METHOD FOR PROCESSING A SIGNAL COMPRISING DETECTION OF INTERFERENCE CAUSED BY A LIGHTNING STRIKE

CROSS REFERENCE TO RELATED APPLICATIONS

This application is a National Stage of International Application No. PCT/FR2018/053262, filed Dec. 13, 2018, claiming priority to French Patent Application No. 1762138, filed Dec. 14, 2017, the entire contents of each of which are herein incorporated by reference in their entireties.

The present invention relates to the field of the processing of a signal of an electronic control unit on board an aircraft, and more specifically relates to a detection of disturbances caused by a lightning strike in an electronic control system on board an aircraft.

Modern aircrafts are equipped with various electronic control units used to take the sensor measurements and/or to control various devices, such as engine or landing gear. An aircraft moving at high altitude is particularly concerned by the risk of lightning strike, due to its remoteness from any other object that may attract lightning, but also due to the possible proximity of cumulonimbus. Even if an aircraft can be partially protected from the effects of the lightning by the role of faraday cage played by its fuselage, the lightning can generate various electrical effects in the electronic components of the aircraft. In particular, an electronic control unit disposed in the nacelle of a turbomachine of an aircraft is particularly exposed.

An effect of the lightning is the possibility of occurrence of errors in data, particularly when the lightning strikes the aircraft when the ECU acquires the measurement from a sensor, which it does continuously. The lightning can then result in electrical disturbances in the sensor and/or the connections between the sensor and the ECU, which are reflected in errors, that is to say incorrect data non-compliant with what should have been acquired by the ECU in the absence of lightning.

The presence of such errors can have serious consequences. Indeed, the data acquired by the ECU can be used to control sensitive members of the aircraft, such as for example an engine.

The use of invalid data to control a sensitive member can cause the generation of a command which is not adapted to the flight conditions, such as the shutdown of the engine. Patent application EP 2 955 488 describes a signal conditioning topology which is consistent with a methodology for converting different types of inputs, including alternating current sensor signals into equivalent units usable in engineering, and indicates that the use of a digital filtering in a conditioner allows better rejection of noises outside the frequency band of interest, which may be present in an avionics environment due to the electrical interferences or to the lightning. However, it turns out that the simple filtering of the noises outside the frequency band of interest does not allow correcting the use of the data, which can be altered in the frequency band of interest during a lightning strike.

PRESENTATION OF THE INVENTION

The invention aims at limiting the effects of the lightning strike on an aircraft, by making it possible to identify data which may have been corrupted by a lightning strike on an aircraft, in a simple manner that does not require the detection of the lightning strike in itself.

To this end, the invention proposes a method for processing a signal of an electronic control unit on board an aircraft, in which said electronic control unit:
  receives an input signal comprising useful data in the useful frequency band,
  implements a first band-pass filtering of the input signal with a first bandwidth to obtain a useful signal containing the useful data, said first bandwidth comprising the useful band,
  uses said useful data,
wherein the electronic control unit also implements a correction of the use of the useful data by a detection of disturbances caused by a lightning strike comprising the following steps:
  a second band-pass filtering of the input signal to obtain a detection signal, the band-pass filtering being with a second bandwidth in which an input signal which has undergone disturbances linked to a lightning strike is likely to present anomalies, the second bandwidth being distinct from the first bandwidth and being comprised in a 1 kHz-15 kHz frequency range,
  a comparison between at least one detection value derived from the detection signal and a detection threshold, whose exceeding is indicative of a lightning strike, and,
  if the detection value exceeds the detection threshold, a correction of the use of the useful data.

The proposed method allows detecting possible effects of a lightning strike in a useful signal, by using the presence of disturbances in the input signal outside the useful frequency band in which the useful data are located. The detection is made at the same time as the processing of the useful signal, and therefore allows correcting the use of the useful data which may have been affected by the lightning strike.

The invention is advantageously supplemented by the following different characteristics taken alone or according to their different possible combinations:
  the input signal does not comprise useful data in the second bandwidth;
  the correction of the use of the useful data comprises not taking into account, by the electronic control unit, useful data simultaneous with the exceeding of the detection threshold by the detection value derived from the detection signal;
  the correction of the use of the useful data comprises determining a bias from the detection signal, and correcting this bias in the useful signal and/or the useful data prior to the use of the useful data;
  the second bandwidth is greater than the first bandwidth;
  the first bandwidth is comprised in a 1 Hz-10 kHz frequency range;
  the detection value derived from the detection signal is representative of an energy of the detection signal;
  a frequency response of the first band-pass filtering has a main lobe and secondary lobes, a frequency response of the second band-pass filtering has a main lobe and secondary lobes, the main lobe of the first band-pass filtering and the main lobe of the second band-pass filtering not overlapping;
  the secondary lobes of the first band-pass filtering outside the main lobe of the second band-pass filtering and the secondary lobes of the second band-pass filtering outside the main lobe of the first band-pass filtering have zeros for the same frequencies;
  to implement the first band-pass filtering of the input signal to obtain a useful signal, the electronic control unit applies a demodulation of the input signal by means of a first sinusoidal reference signal at a first frequency comprised in the first bandwidth to obtain the useful signal, and to implement the second band-pass filtering of the input signal to obtain a detection signal, the electronic control unit implements a demodulation of the input signal by means of a second sinusoidal reference signal at a second frequency comprised in the second bandwidth distinct from the first bandwidth to obtain the detection signal;

the second frequency is an integer multiple of the first frequency.

The invention also relates to a computer program product comprising program code instructions recorded on a non-transitory medium usable in a computer for the execution of the steps of a method according to the invention when said program is executed on a computer using said non-transitory medium.

The invention also relates to an electronic control unit on board an aircraft, said electronic control unit being configured to implement a method according to the invention.

PRESENTATION OF THE FIGURES

Other characteristics, aims and advantages of the invention will emerge from the following description, which is purely illustrative and non-limiting, and which should be read with reference to the appended drawings wherein:

FIG. 1 shows schematically a main diagram of steps implemented in a possible embodiment of the invention;

FIG. 2 schematically illustrates an example of digital demodulation that can be implemented in a possible embodiment of the invention to perform a band-pass filtering of a signal;

FIG. 3 shows examples of frequency response of a first band-pass filtering and a of second band-pass filtering performed by means of digital demodulations;

FIG. 4 shows an example of a spectral profile of the result of a fast Fourier transformation applied to a signal modeling a disturbance generated by a lightning strike.

DETAILED DESCRIPTION

The method is implemented by an electronic control unit on board an aircraft. The aircraft can be any machine moving in the air, such as an aircraft, a helicopter, or a drone for example. An electronic control unit, generally designated by the initials ECU, designates an on-board calculator or on-board system which receives sensor measurement signals or signals coming from other calculators, and controls physical devices or provides signals to other calculators. An example of electronic control unit to which the invention applies is the main digital electronic control generally designated by the initials FADEC, "Full Authority Digital Engine Control". This is a digital control system which interfaces between the cockpit and an engine of an aircraft for controlling the latter. More specifically, the FADEC monitors all the circuits of an engine in response to the commands given to the aircraft, also communicating information of the aircraft to provide the indications to the cockpit, for the monitoring of the operational behavior of the engine, for the maintenance report and the troubleshooting. Another example of an electronic control unit is a unit used to take sensor measurements to process and transmit them to the FADEC, and which is therefore at the origin of data processed by FADEC.

In so far as the lightning strike on an aircraft can cause anomalies in most on-board electronic systems, the detection of disturbances caused by a lightning strike can be implemented in any electronic control unit implementing a method for processing a signal comprising useful data in a determined frequency band.

Figure 1:
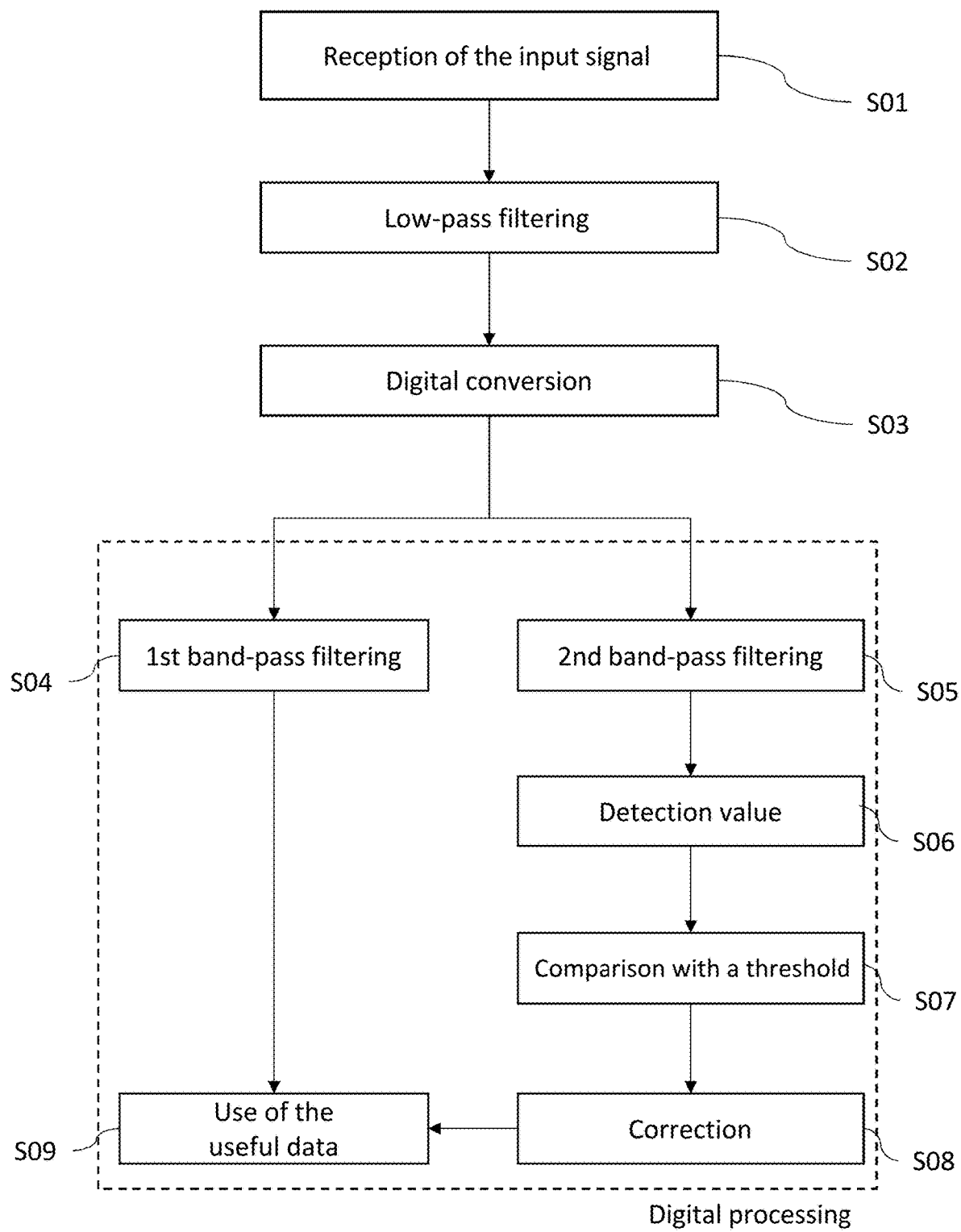

Referring to FIG. 1, the method for processing a signal comprises a first step S01 of receiving the input signal. This input signal comprises useful data in a frequency band, called useful band. For example, the input signal may comprise amplitude-coded data modulated by a sinusoidal signal. Preferably, the useful band is comprised in a 1 Hz-10 kHz frequency range. The useful band can be reduced to a single frequency.

By way of non-limiting example used for illustration purposes, a linear variable-differential transformer or LVDT is used to measure the movements of a motor valve. Such a transformer generates a signal constituted by a sinusoid at a frequency of 3 kHz, the amplitude of which is proportional to the movement of the motor valve. The useful data are here constituted by the amplitudes of the signal, while the useful band is centered around the 3 kHz frequency, and can for example be considered as being comprised between 2 kHz and 4 kHz for example. Of course, the invention can be applied to signals coming from other components, such as for example a resolver determining the angle of a control handle.

Preferably, the subsequent processing of the signal is a digital processing. To this end, a low-pass filtering step S02 can be provided, in order to avoid problems of aliasing, by choosing the cut-off frequency as a function of the sampling frequency of the digital conversion to come. Of course, this cut-off frequency of the low-pass filtering must be higher than the frequency bands used subsequently. An analog to digital converter then implements a digital conversion S03 to transform the analog input signal into digital input signal.

The electronic control unit then implements a first band-pass filtering (step S04) of the input signal, with a first bandwidth to obtain a useful signal containing the useful data. Of course, the first bandwidth covers the useful band. It is meant by bandwidth the frequency band in all of which the attenuation remains below a specified value, corresponding conventionally to an energy reduced by half (−3 dB), that is to say an amplitude reduced by 70%, compared to the maximum. Preferably, the first bandwidth is centered on the useful band. There are several ways to make this first band-pass filtering. One solution is to convert the input signal into the frequency domain and to select the appropriate frequency range, in this case corresponding to the first bandwidth. For this, it is possible to use for example a fast Fourier transformation.

However, within the context of the example of this description where the input signal is based on a sinusoidal signal, it is preferable that the electronic control unit applies demodulation of the input signal by means of a first sinusoidal reference signal at a first frequency comprised in the useful band to obtain the useful signal. Indeed, such a demodulation is simple to implement and requires less resource than the recourse to a fast Fourier transformation.

Figure 2:
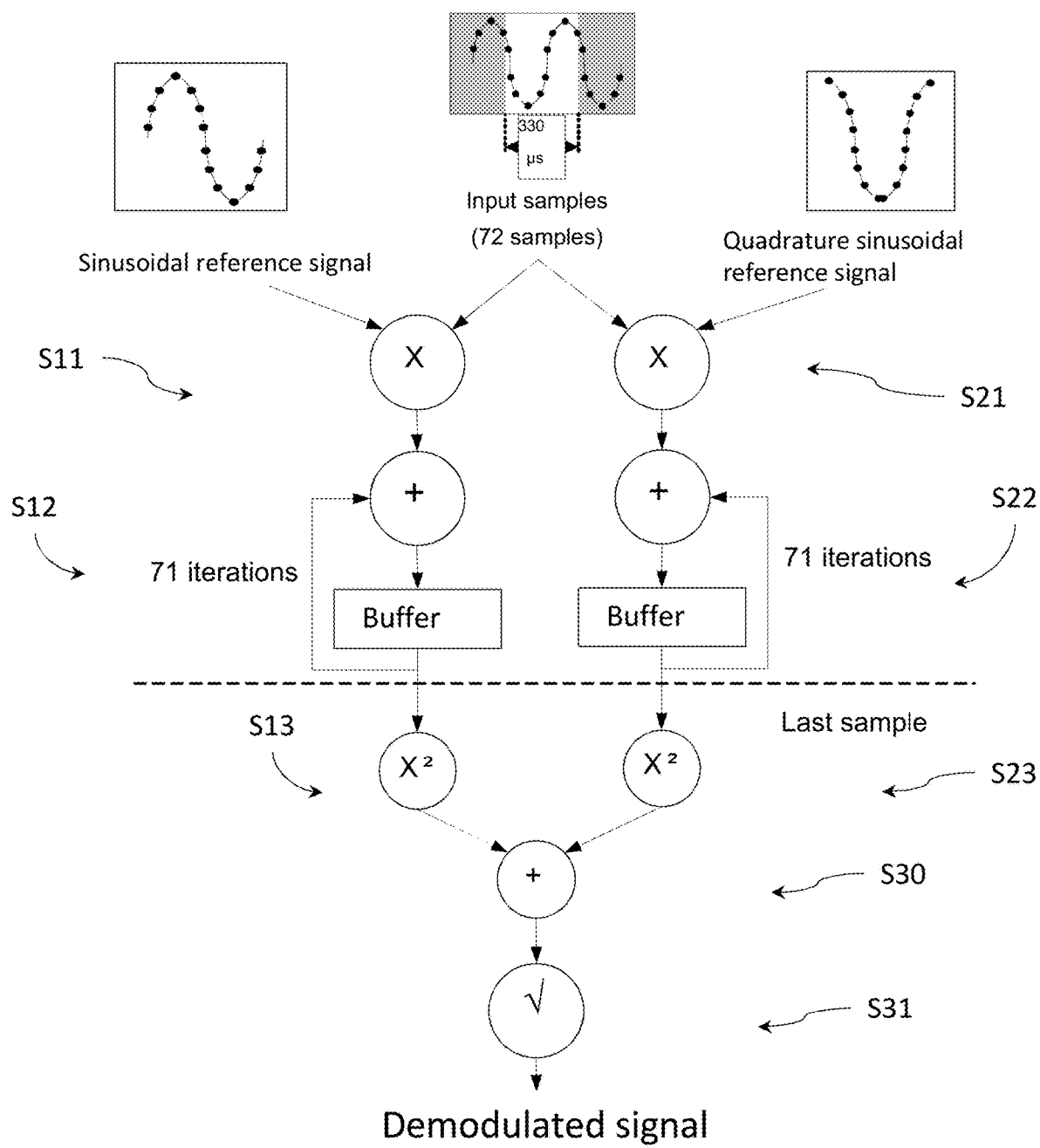

FIG. 2 shows an example of implementation of such digital demodulation. This modulation occurs on successive time windows. In the example illustrated, a time window extends over 330 μs, corresponding to 72 samples for a sampling frequency of about 220 kHz. The operations described are therefore performed on these 72 input samples. The first sinusoidal reference signal has the same sampling frequency and the same number of samples. In the illustrative example, the first sinusoidal reference signal is a sinusoid at a 3 kHz frequency, like the frequency of the signal emitted by the linear variation-differential transformer.

The processing is split into two branches. In a first branch, the input samples are multiplied (step S11) by the samples of the first sinusoidal reference signal before being summed (step S12) during 71 iterations during which the intermediate results are stored in a buffer memory. Following the processing of the last of the 72 samples, the resulting sum is squared (step S13).

In the second branch, the input samples are multiplied (step S21) by the samples of the first quadrature sinusoidal reference signal, that is to say offset over a quarter of a period. Thus, if the first sinusoidal reference signal is a sine, the first quadrature sinusoidal reference is a cosine of the same amplitude and same period. Then, the resulting samples are summed (step S22) during 71 iterations during which the intermediate results are stored in a buffer memory. Following the processing of the last of the 72 samples, the resulting sum is squared (step S23).

The results of the two branches are then summed (step S30), then the square root of the resulting sum is calculated (step S31). This results in the demodulated signal. In the case of the first band-pass filtering, the useful signal is thus obtained.

At the same time, the electronic control unit implements a second band-pass filtering (step S05) of the input signal, with a second bandwidth to obtain a detection signal. The second bandwidth is distinct from the first bandwidth and is comprised in the 1 kHz-15 kHz frequency range. Preferably, the second bandwidth is greater than the first bandwidth. Preferably, the first bandwidth and the second bandwidth are separated by at least 0.5 kHz. In the illustrative example, the second bandwidth is centered on 9 kHz. In fact, the second bandwidth is preferably centered on a frequency which is an integer multiple of the frequency on which the first bandwidth is centered.

The second band-pass filtering can comply with the same conditions as those of the first band-pass filtering described above. Particularly, a fast Fourier transformation can be implemented. However, as with the first band-pass filtering, to implement the second band-pass filtering of the input signal to obtain a detection signal, the electronic control unit preferably implements a demodulation of the input signal by means of a second sinusoidal reference signal at a second frequency comprised in the second bandwidth distinct from the first bandwidth to obtain the detection signal. In the illustrative example, the second sinusoidal reference signal is a sinusoid at a frequency of 9 kHz. The digital demodulation to obtain the detection signal can be made according to the conditions described with reference to FIG. 2.

FIG. 3 shows examples of frequency response of a first band-pass filtering and of a second band-pass filtering carried out by means of the digital demodulations previously described, in the context of the illustrative example. It includes, in arbitrary units and according to the frequency in Hertz:
- the response of the first band-pass filtering, with a main lobe 3a centered on the first frequency at 3 kHz and secondary lobes 3b of lower amplitudes; and
- the response of the second band-pass filtering, with a main lobe 9a centered on the second frequency at 9 kHz, and secondary lobes 9b of lower amplitudes.

It can be observed that the main lobe 3a of the first band-pass filtering and the main lobe 9a of the second band-pass filtering do not overlap. Furthermore, it can be seen that the bandwidths of the first band-pass filtering and of the second band-pass filtering, conventionally corresponding to an energy reduced by half (−3 dB), that is to say to an amplitude reduced by 70%, compared to the maximum, are clearly distinct, and separated by at least 0.5 kHz. These characteristics are particularly advantageous and are preferably sought for the first band-pass filtering and the second band-pass filtering.

The electronic control unit then determines a detection value derived from the detection signal (step S06). This detection value is representative of the energy of the detection signal. In the absence of a lightning strike, the energy of the detection signal is close to zero, since the input signal does not comprise useful data in the second bandwidth. There is therefore essentially noise in the detection signal. The detection value is for example average amplitude, energy of the signal, a power spectral density, etc. Of course, several detection values can be used for the same portion of the signal.

The electronic control unit then compares (step S07) this detection value to a detection threshold. The detection threshold naturally depends on the choice which has been made for the nature of the detection value, but also on the desired sensitivity. Typically, the detection threshold must be higher than the detection values that noise may generate, in order to limit the false detections. When the detection value exceeds the detection threshold, that is to say is further away from zero than the detection threshold, this means that anomalies are present in the input signal in the second band bandwidth, even though there is no useful data in this second bandwidth. These anomalies are not due to noise, since the comparison to the detection threshold tends to eliminate this possibility. These anomalies are therefore probably caused by a lightning strike.

Indeed, a lightning strike typically induces interfering electrical signals on the wiring connecting electronic components of the aircraft, or even in the electronic components themselves (in particular in the sensors). For example, FIG. 4 shows an example of a spectral profile of the result of a fast Fourier transformation applied to a signal modeling a disturbance generated by a lightning strike with a logarithmic abscissa. More specifically, it is the spectrum of the waveform WF6 as defined in document RTCA DO-160G "Environmental Conditions and test Procedures for Airborne Equipment", also referenced under the name EUROCAE ED-14G.

It is observed that this waveform has a high level in the frequency band [100 Hz; 15 kHz]. Thus, an input signal which has undergone disturbances linked to a lightning strike is likely to present anomalies in this same frequency band. By looking for the presence of these anomalies in a frequency band distinct from the useful band where the useful data are located, it is possible to detect that a lightning strike occurred. However, the disturbances could corrupt the useful data.

As this detection takes place at the same time as the processing of the useful data of the input signal, it is possible to implement a correction (step S08) of the use of the useful data present in the useful signal (step S09). This correction can be implemented prior to the processing of the useful data or simultaneously. This correction may comprise an action on the useful signal or on the useful data, or simply a modification in the use of these useful data. Particularly, the correction of the use of the useful data may comprise not taking into account, by the electronic control unit, useful data simultaneous with the exceeding of the detection threshold by the detection value derived from the detection signal. Indeed, since the exceeding of the detection threshold is indicative of a lightning strike, the useful data may be altered; it is better not to take them into account. In the illustrative example, the amplitude of the useful signal will therefore not be used to determine the movement of a motor valve, temporarily.

However, rather than losing the useful data by not processing it, it may be advantageous to use the detection signal to correct the useful signal and/or the useful data. Indeed, as can be seen in FIG. 4, the spectral profile of a disturbance generated by a lightning strike has a relatively constant density in the range 1 kHz-10 kHz. Consequently, it is likely that the consequences of the lightning strike in the detection signal are the same as in the useful signal.

Preferably, the correction of the use of the useful data thus comprises determining a bias from the detection signal, and correcting this bias in the useful signal and/or the useful data prior to the use of the useful data. In the illustrative example, if the detection signal has an amplitude of 50 mV, then 50 mV can be subtracted from the amplitude of the useful signal, the one normally having values comprised between 5 and 6 V. In fact, it is preferable to correct the bias only if it represents in value less than 20% of the value of the useful data. However, in order to properly correct such a bias, it is preferable that the frequency response of the first band-pass filtering and the frequency response of the second band-pass filtering have some similarities at their secondary lobes 3b, 9b. Preferably, the secondary lobes 3b of the first band-pass filtering outside the main lobe 9a of the second band-pass filtering and the secondary lobes 9b of the second band-pass filtering outside the main lobe 3a of the first band-pass filtering have zeros for the same frequencies. The secondary lobes 3b, 9b, outside the areas of overlap with the main lobes 3a, 3b, then overlap. To do so, the second frequency is preferably an integer multiple of the first frequency used for the demodulation during the first band-pass filtering. Thus, in the illustrative example, the first frequency is of 3 kHz while the second frequency is of 9 kHz, i.e. a multiplication by a factor of 3.

The invention is not limited to the embodiment described and represented in the appended figures. Modifications remain possible, in particular from the point of view of the constitution of the various technical characteristics or by substitution of technical equivalents, without however departing from the domain of protection of the invention.

The invention claimed is:

1. A method for processing a signal of an electronic control unit on board an aircraft, wherein said electronic control unit:
   receives an input signal comprising useful data in a useful frequency band,
   implements a first band-pass filtering of the input signal with a first bandwidth to obtain a useful signal containing the useful data, said first bandwidth comprising the useful band,
   uses said useful data,
   wherein the electronic control unit also implements a correction of a use of the useful data by a detection of disturbances caused by a lightning strike comprising the following steps:
   a second band-pass filtering of the input signal to obtain a detection signal, the second band-pass filtering being with a second bandwidth in which an input signal which has undergone disturbances linked to a lightning strike is likely to present anomalies, the second bandwidth being distinct from the first bandwidth and being comprised in a 1 kHz-15 kHz frequency range, wherein a frequency response of the first band-pass filtering has a main lobe and secondary lobes, a frequency response of the second band-pass filtering has a main lobe and secondary lobes, the main lobe of the first band-pass filtering and the main lobe of the second band-pass filtering not overlapping,
   a comparison between at least one detection value derived from the detection signal and a detection threshold, whose exceeding is indicative of a lightning strike, and
   if the detection value exceeds the detection threshold, a correction of the use of the useful data.

2. The method of claim 1, wherein the input signal does not comprise useful data in the second bandwidth.

3. The method of claim 1, wherein the correction of the use of the useful data comprises not taking into account, by the electronic control unit, useful data simultaneous with an exceeding of the detection threshold by the detection value derived from the detection signal.

4. The method of claim 1, wherein the correction of the use of the useful data comprises determining a bias from the detection signal, and correcting this bias in the useful signal and/or the useful data prior to the use of the useful data.

5. The method of claim 1, wherein the second bandwidth is greater than the first bandwidth.

6. The method of claim 1, wherein the first bandwidth is comprised in a 1 Hz-10 kHz frequency range.

7. The method of claim 1, wherein the detection value derived from the detection signal is representative of an energy of the detection signal.

8. The method of claim 1, wherein the secondary lobes of the first band-pass filtering outside the main lobe of the second band-pass filtering and the secondary lobes of the second band-pass filtering outside the main lobe of the first band-pass filtering have zeros for same frequencies.

9. The method of claim 1, wherein to implement the first band-pass filtering of the input signal to obtain a useful signal, the electronic control unit applies a demodulation of the input signal by means of a first sinusoidal reference signal at a first frequency comprised in the first bandwidth to obtain the useful signal, and to implement the second band pass filtering of the input signal to obtain a detection signal, the electronic control unit implements a demodulation of the input signal by means of a second sinusoidal reference signal at a second frequency comprised in the second bandwidth distinct from the first bandwidth to obtain the detection signal.

10. The method of claim 9, wherein the second frequency is an integer multiple of the first frequency.

11. A computer program product comprising program code instructions recorded on a non-transitory medium usable in a computer for the execution of the steps of a method according to claim 1 when said program is executed on a computer reads using said non-transitory medium.

12. An electronic control unit on board an aircraft, said electronic control unit being configured to:
   receive an input signal comprising useful data in a useful frequency band,
   implement a first band-pass filtering of the input signal with a first bandwidth to obtain a useful signal containing the useful data, said first bandwidth comprising the useful band,
   use said useful data,
   wherein the electronic control unit is also configured to implement a correction of a use of the useful data by a detection of disturbances caused by a lightning strike comprising the following steps:
   a second band-pass filtering of the input signal to obtain a detection signal, the second band-pass filtering being with a second bandwidth in which an input signal which has undergone disturbances linked to a lightning strike is likely to present anomalies, the second bandwidth being distinct from the first bandwidth and being comprised in a 1 kHz-15 kHz frequency range, wherein a frequency response of the first band-pass filtering has a main lobe and secondary lobes, a frequency response of the second band-pass filtering has a main lobe and secondary lobes, the main lobe of the first band-pass filtering and the main lobe of the second band-pass filtering not overlapping, a comparison between at least one detection value derived from the detection signal and a detection threshold, whose exceeding is indicative of a lightning strike, and if the detection value exceeds the detection threshold, a correction of the use of the useful data.

\* \* \* \* \*